United States Patent
Law et al.

(10) Patent No.: US 11,751,483 B2
(45) Date of Patent: Sep. 5, 2023

(54) SPIN DIODE DEVICES

(71) Applicant: GLOBALFOUNDRIES Singapore Pte. Ltd., Singapore (SG)

(72) Inventors: Wai Cheung Law, Singapore (SG); Grayson Dao Hwee Wong, Singapore (SG); Kazutaka Yamane, Singapore (SG); Chim Seng Seet, Singapore (SG); Wen Siang Lew, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 296 days.

(21) Appl. No.: 17/134,582

(22) Filed: Dec. 28, 2020

(65) Prior Publication Data
US 2022/0209102 A1    Jun. 30, 2022

(51) Int. Cl.
*H10N 50/10* (2023.01)
*H01F 10/32* (2006.01)
*H03B 15/00* (2006.01)
*H03D 1/10* (2006.01)
*H10N 50/80* (2023.01)
*H10N 50/85* (2023.01)

(52) U.S. Cl.
CPC ......... *H10N 50/10* (2023.02); *H01F 10/3272* (2013.01); *H01F 10/3286* (2013.01); *H03B 15/006* (2013.01); *H03D 1/10* (2013.01); *H10N 50/80* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 5,750,270 A * | 5/1998 | Tang | G11B 5/3967 |
| 8,860,159 B2 | 10/2014 | Meitzler et al. | |
| 10,468,171 B1 | 11/2019 | Law et al. | |
| 10,658,574 B2 * | 5/2020 | Chatterjee | G11C 11/16 |
| 11,249,150 B2 * | 2/2022 | Wang | G01R 33/093 |
| 11,307,270 B2 * | 4/2022 | Wang | G11C 11/1675 |
| 2014/0362624 A1 | 12/2014 | Yamada | |

FOREIGN PATENT DOCUMENTS

| | | | | |
|---|---|---|---|---|
| CN | 105223414 A | | 1/2016 | |
| CN | 110459674 A | * | 11/2019 | ........... G11C 11/161 |

OTHER PUBLICATIONS

Wang et al. (J. Appl. Phys., 106, 053905-1 to 053905-6, 2009). (Year: 2009).*
Fang et al., "Giant spin-torque diode sensitivity in the absence of bias magnetic field", Nature Communications, 2016, pp. 1-7.
Tulapurkar et al., "Spin-torque diode effect in magnetic tunnel junctions", Nature, 2005, pp. 339-342, vol. 438.

* cited by examiner

*Primary Examiner* — Kevin M Bernatz
(74) *Attorney, Agent, or Firm* — VIERING JENTSCHURA & PARTNER MBB (57) ABSTRACT

According to various embodiments, a spin diode device may include a magnetic tunnel junction stack. The magnetic tunnel junction stack may include a lower magnetic layer, a tunnel barrier layer over the lower magnetic layer, and an upper magnetic layer over the tunnel barrier layer. The lower magnetic layer may include a lower magnetic film. The tunnel barrier layer comprising an insulating material. The upper magnetic layer may include an upper magnetic film. Each of the lower magnetic film and the upper magnetic film may have perpendicular magnetic anisotropy.

20 Claims, 7 Drawing Sheets

SPIN DIODE DEVICES

TECHNICAL FIELD

Various embodiments relate to spin diode devices that include a magnetic tunnel junction.

BACKGROUND

There is an increasing need for microwave detection devices that are capable of detecting low power microwaves. Existing solutions, such as spin diodes, typically perform poorly at detecting low power microwaves. In order to improve the performance of spin diodes for low power operations, external energy is typically needed to induce resonance in the magnetic tunnel junction stacks of the spin diodes. However, having to provide an external source of energy to the spin diodes translate into an overall larger device size, and limited endurance of the device. Further, the existing spin diodes are only able to harness microwaves of a single frequency bandwidth. As such, multiples of the spin diodes are required to harness microwaves of a plurality of frequency bandwidths.

SUMMARY

According to various embodiments, there may be provided a spin diode device. The spin diode device may include a magnetic tunnel junction stack. The magnetic tunnel junction stack may include a lower magnetic layer, a tunnel barrier layer over the lower magnetic layer, and an upper magnetic layer over the tunnel barrier layer. The lower magnetic layer may include a lower magnetic film. The tunnel barrier layer comprising an insulating material. The upper magnetic layer may include an upper magnetic film. Each of the lower magnetic film and the upper magnetic film may have perpendicular magnetic anisotropy.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

The embodiments generally relate to spin diode devices that include magnetic tunnel junctions. The spin diode devices may be spintronic devices. The spin diode devices may be used in applications such as WiFi energy harvesting, embedded object sensors, microwave imaging for medical or nondestructive testing and microwave sensor in military applications.

Figure 1:
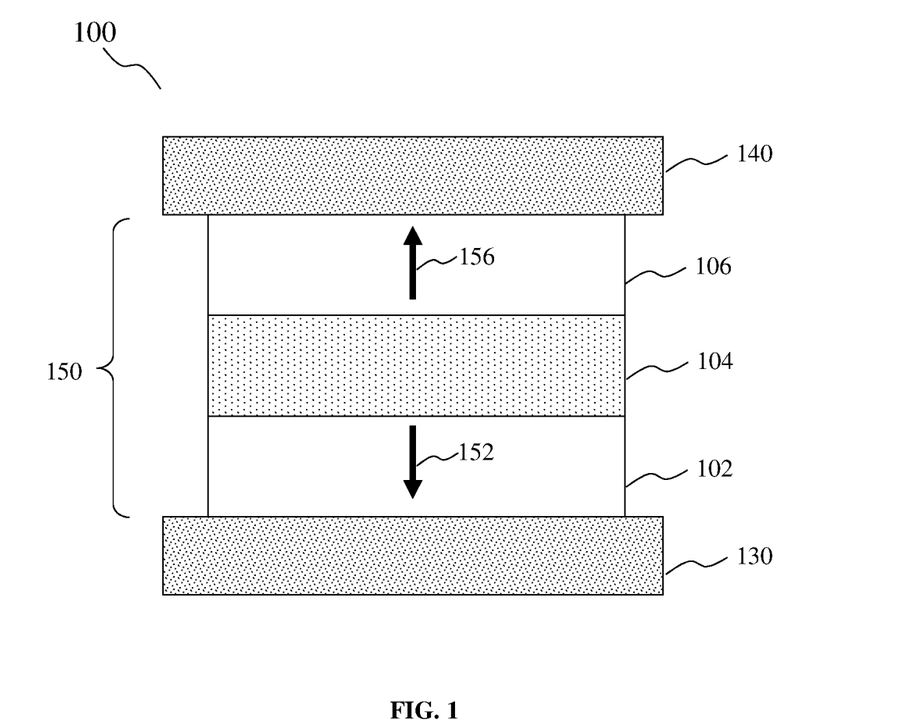
FIG. 1 shows a schematic diagram of a spin diode device according to various non-limiting embodiments.

FIG. 1 shows a schematic diagram of a spin diode device 100 according to various non-limiting embodiments. The spin diode device 100 may include a lower electrode 130 and an upper electrode 140. The spin diode device 100 may include a magnetic tunnel junction (MTJ) stack 150 disposed between the lower and upper electrodes 130, 140. The MTJ stack 150 may include three general layers, namely a lower magnetic layer 102, an upper magnetic layer 106, and a tunnel barrier layer 104 disposed between the lower and upper magnetic layers 102, 106.

The lower magnetic layer 102 may be arranged over the lower electrode 130. The tunnel barrier layer 104 may be arranged over the lower magnetic layer 102. The upper magnetic layer 106 may be arranged over the tunnel barrier layer 104. The tunnel barrier layer 104 may separate the lower magnetic layer 102 from the upper magnetic layer 106. The tunnel barrier layer 104 may be non-magnetic, and may magnetically decouple the lower magnetic layer 102 from the upper magnetic layer 106. The upper electrode 140 may be arranged over the upper magnetic layer 106. The lower and upper magnetic layers 102, 106 may each include at least one magnetic film that has perpendicular magnetic anisotropy (PMA).

The tunnel barrier layer 104 may include magnesium oxide. In alternative embodiments, the tunnel barrier layer 104 may include aluminum oxide or other materials suitable for magnetically decoupling overlying layers from underlying layers. According to various non-limiting embodiments, the thickness of the tunnel barrier layer 104 may be about 0.8 nm to about 2.0 nm. The tunnel barrier layer 104 may be sufficiently thin, such that electrons may tunnel through the tunnel barrier layer 104, from the upper magnetic layer 106 to the lower magnetic layer 102, or vice-versa.

According to various non-limiting embodiments, the lower and upper electrodes 130, 140 may each include tantalum. Each of the lower and upper electrodes 130, 140 may be about 5 nm in thickness.

According to various non-limiting embodiments, the lower and upper magnetic layers 102, 106 may each include one magnetic film that has PMA. For example, the lower magnetic layer 102 may include a lower magnetic film (not shown in FIG. 1) having an equilibrium magnetization direction 152 that is perpendicular to a plane defined by the lower magnetic layer 102. For example, the upper magnetic layer 106 may similarly include an upper magnetic film (not shown in FIG. 1) having an equilibrium magnetization direction 156 that is perpendicular to a plane defined by the upper magnetic layer 106. The magnetization direction 152 of the lower magnetic layer 102 may be opposite, in other words, antiparallel, to the magnetization direction 156 of the upper magnetic layer 106.

Figure 2:
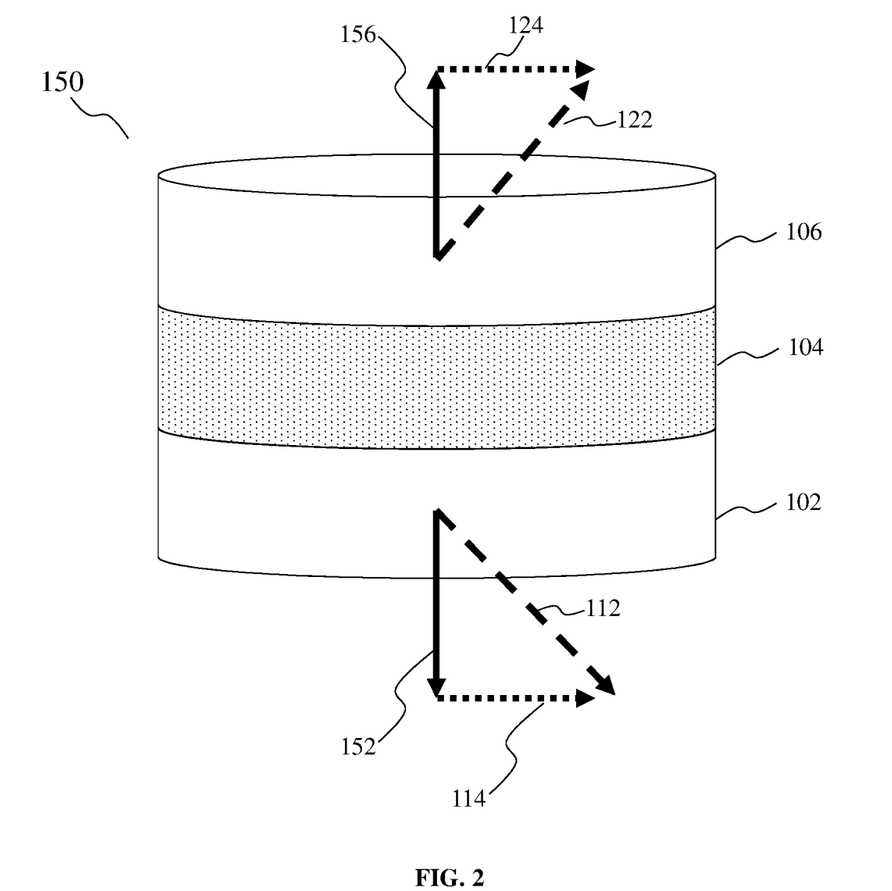
FIG. 2 shows a schematic diagram of a MTJ stack, and illustrates the operating principle of the spin diode device of FIG. 1.

FIG. 2 shows a schematic diagram of the MTJ stack 150, and illustrates the operating principle of the spin diode device 100. The lower magnetic layer 102, or specifically, the lower magnetic film in the lower magnetic layer 102, may be structured to have a natural ferromagnetic resonance (FMR) frequency $f_L$. The upper magnetic layer 106, or specifically, the upper magnetic film in the upper magnetic layer 106, may be structured to have a natural FMR $f_U$. The natural FMR frequency of a magnetic film refers to the frequency at which the incident microwave radiation and the precessional motion of the magnetization within a magnetic film couples, in the absence of an external magnetic field.

In the presence of a microwave oscillating to frequency $f_L$, the lower magnetic layer 102, instead of the upper magnetic layer 106, may absorb the microwave energy. The absorbed microwave energy may excite magnetic moment in the lower magnetic film of the lower magnetic layer 102 into FMR. Consequently, the magnetization direction of the lower magnetic layer 102 may change, for example, from the perpendicular direction 152 to a new direction 112. The new direction 112 may include an in-plane component 114. The change in direction from the perpendicular direction 152 to the new direction 112 may be a slight shift, such that the new direction 112 is closer to the perpendicular direction 152 than to an in-plane direction.

The magnetization direction of the upper magnetic layer 106 may remain relatively unchanged, as compared to that of the lower magnetic layer 102. The change in magnetization direction of the lower magnetic layer 102 relative to the magnetization direction of the upper magnetic layer 106 may cause a change in an effective resistance across the MTJ stack 150, thereby causing a rectification effect across the MTJ stack 150. The change in effective resistance across the MTJ stack 150 may change a magnitude and/or direction of an electrical current travelling between the lower and upper electrodes 130, 140. The spin diode device 100 may detect the microwave based on at least one of the magnitude of the electrical current, the direction of the electrical current, or combinations thereof.

On the other hand, if the microwave incident on the spin diode device 100 is oscillating to frequency $f_U$, the upper magnetic layer 106 may absorb substantially more of the microwave energy than the lower magnetic layer 102. The absorbed microwave energy may excite electrons in the upper magnetic film of the upper magnetic layer 106 into FMR. Consequently, the magnetization direction of the upper magnetic layer 106 may change, for example, from the perpendicular direction 156 to a new direction 122. The new direction 122 may include an in-plane component 124. The magnetization direction of the lower magnetic layer 102 may remain relatively unchanged, as compared to that of the upper magnetic layer 106. The change in magnetization direction of the lower magnetic layer 102 relative to the magnetization direction of the upper magnetic layer 106 may cause a change in an effective resistance across the MTJ stack 150, thereby causing a rectification effect across the MTJ stack 150. The change in effective resistance across the MTJ stack 150 may change a magnitude and/or direction of an electrical current travelling between the lower and upper electrodes 130, 140. The spin diode device 100 may detect the microwave based on at least one of the magnitude of the electrical current, the direction of the electrical current, or combinations thereof.

Further, the change in effective resistance of the MTJ stack 150 caused by a change in magnetization direction of the upper magnetic layer 106 may differ from the change in effective resistance of the MTJ stack 150 caused by a change in the magnetization direction of the lower magnetic layer 102. As such, the spin diode device 100 may also determine the oscillation frequency of the microwave, based on the magnitude and direction of the electrical current travelling between the lower and upper electrodes 130, 140.

While FIG. 2 shows the magnetization directions of the lower and upper magnetic layers 102, 106 being opposite, i.e. antiparallel, in alternative embodiments, the lower and upper magnetic layers 102, 106 may have the same magnetization direction.

Figure 3:
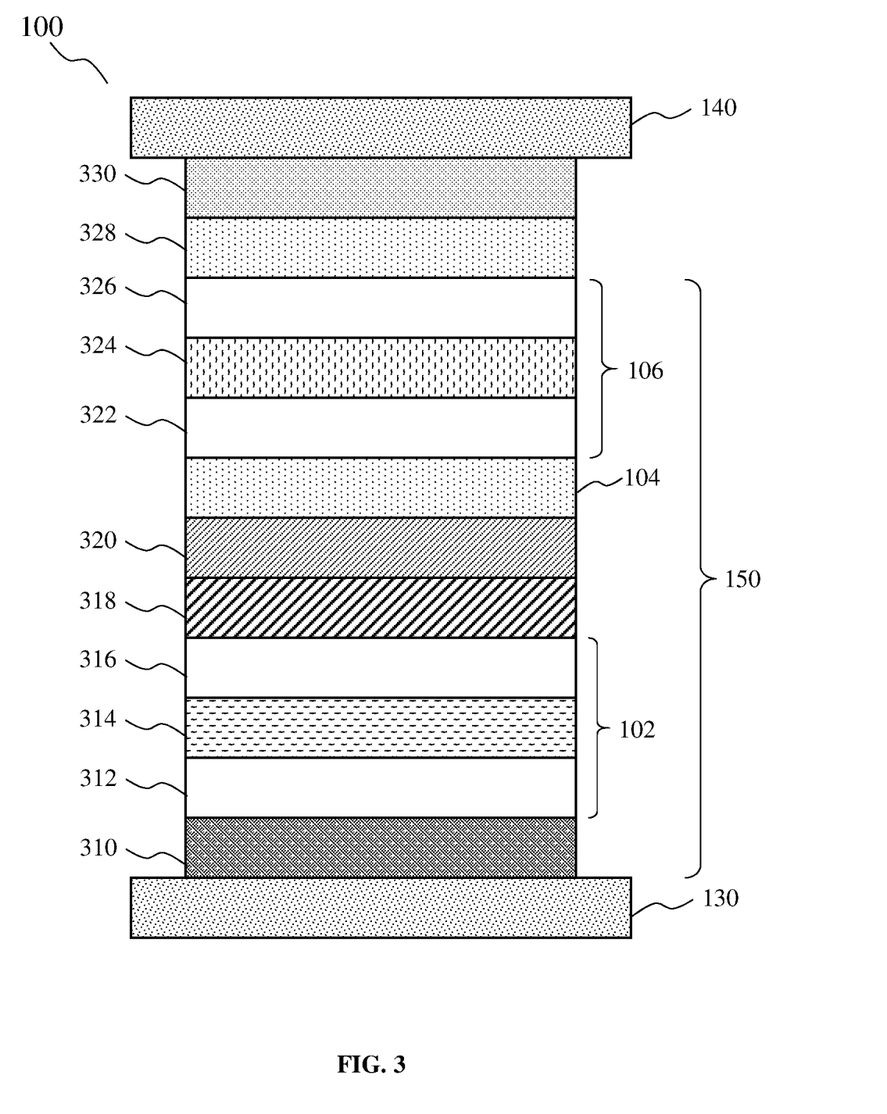
FIG. 3 shows a schematic diagram of a spin diode device 300 according to various non-limiting embodiments.

FIG. 3 shows a schematic diagram of a spin diode device 300 according to various non-limiting embodiments.

The lower magnetic layer 102 may include a lower magnetic film 312. The lower magnetic layer 102 may further include a lower coupling layer 314 disposed over the lower magnetic film 312, and a further lower magnetic film 316 disposed over the lower coupling layer 314.

The lower magnetic film 312 and the further lower magnetic film 316 may each include cobalt, platinum, and combinations thereof. In alternative embodiments, the lower magnetic film 312 and the further lower magnetic film 316 may include various combinations of nickel, terbium, palladium, iron, boron, or other metals, or combinations thereof. The different elements in the lower magnetic film 312 and the further lower magnetic film 316 may be alloyed or formed of successive layers, so the lower magnetic film 312 and the further lower magnetic film 316 may independently include a plurality of sub-layers in some embodiments. The magnetic property of the combined lower magnetic film 312 and the further lower magnetic film 316 may be the magnetic property for the lower magnetic layer 102 in embodiments with only two magnetic films in the lower magnetic layer 102. The lower magnetic film 312 and the further lower magnetic film 316 may include pinned layers.

According to various non-limiting embodiments, each of the lower magnetic film 312 and the further lower magnetic film 316 may include at least one bi-layer film, for example, a film including cobalt arranged over or under another film including platinum, for example, a Co/Pt film. The lower magnetic film 312 may include a plurality of the bi-layer films, arranged successively in a stack. For example, the lower magnetic film 312 may include up to six of these bi-layer films, i.e. $[Co/Pt]_6$. For example, the further lower magnetic film 316 may include up to four of these bi-layer films, i.e. $[Co/Pt]_4$. The number of bi-layer film repetitions required may depend on the target microwave frequencies. In general, the higher the target microwave frequencies, the more bi-layer films will be required.

Each of the lower magnetic films 312, 316 may be magnetically anisotropic and may have PMA. The FMR frequency $f_L$ of the lower magnetic layer 102 may depend on the thicknesses of the film including cobalt film and the other film including platinum. For example, the thickness of each of the cobalt film and the platinum film may be about 0.2 to 0.5 nm, for an operating frequency range of about 20 GHz to about 60 GHz. In an exemplary embodiment, the bi-layer film stack may include 0.4 nm of cobalt and 0.4 nm of platinum.

The lower coupling layer 314 may be an inter-layer exchange coupling layer that provides an anti-ferromagnetic exchange between the lower magnetic film 312 and the further lower magnetic film 316. The anti-ferromagnetic exchange may help reduce or compensate for stray magnetic field effects from the lower magnetic film 312 and the further lower magnetic film 316. The lower coupling layer 314 may force the magnetization directions of the lower magnetic film 312 and the further lower magnetic film 316 to be antiparallel. By having opposite magnetization directions, the lower magnetic film 312 and the further lower magnetic film 316 may resonate at different frequencies and thereby absorb microwaves of different frequency bandwidths. The lower coupling layer 314 may include ruthenium (Ru), iridium (Ir), rhodium (Rh), or other materials. In various non-limiting embodiments, the lower coupling layer 314 may include ruthenium at from about 50 to about 100 weight percent, or from about 80 to 100 weight percent, based on a total weight of the lower coupling layer 314. The thickness of the lower coupling layer 314 may be about 0.3 nm to 0.9 nm.

The upper magnetic layer 106 may overlie the tunnel barrier layer 104. The upper magnetic layer 106 may include an upper magnetic film 322. The upper magnetic layer 106 may further include an insertion layer 324 over the upper magnetic film 322, and a further upper magnetic film 326 over the insertion layer 324. The upper magnetic film 322 and the further upper magnetic film 326 may include pinned layers. For example, the upper magnetic film 322 may include at least one pinned layer, and the further upper magnetic film 326 may also include at least one pinned layer. The upper magnetic films 322, 326 may have the same composition, or they may have different compositions, and there may be more, less, or the same number of pinned layers in the upper magnetic films 322, 326. The elements in the upper magnetic films 322, 326 may be present as alloys or as layers of pure material or layers of alloys. The upper magnetic films 322, 326 may include cobalt, iron, boron, alloys thereof, or mixtures thereof. For example, each of the upper magnetic films 322, 326 may include a cobalt-iron-boron alloy, such as $Co_{20}Fe_{60}B_{20}$. The upper magnetic films 322, 326 may be magnetically "soft" such that their spin transfer torque and their magnetization directions may be variable. Each of the upper magnetic films 322, 326 may be magnetically anisotropic and may have PMA. The thickness of the upper magnetic films 322, 326 may each be about 0.3 nm to about 1.2 nm.

The insertion layer 324 may be provided between the upper magnetic film 322 and the further upper magnetic film 326. The insertion layer 324 may be non-magnetic. The insertion layer 324 may provide ferromagnetic coupling between the upper magnetic films 322, 326 and may be thin enough to be amorphous. In alternative embodiments, the insertion layer 324 may be crystalline. The insertion layer 324 may include tantalum, molybdenum, tungsten, iron or other components, as alloys, or as individual elements. According to various non-limiting embodiments, the insertion layer 324 may be about 0.4 nm in thickness.

The thicknesses of the lower magnetic films 312, 316, and the upper magnetic films 322, 326 may be critical to achieve PMA and may directly affect the natural FMR frequencies of these magnetic films. The natural FMR frequencies of these magnetic films may determine the operating frequencies of the spin diode device 300. The spin diode device 300 may be configured to detect microwaves that oscillate at frequencies that matches or coincides with the natural FMR frequencies of the lower magnetic films 312, 316. The spin diode device 300 may be configured to detect microwaves that oscillate at frequencies that matches or coincides with the natural FMR frequencies of the upper magnetic films 322, 326.

In general, the FMR frequency, f, of a magnetic film may be determined as follows:

$$f = \gamma(H_{ext} + 4\pi M_{eff})$$

where γ represents the gyromagnetic coefficient of the magnetic film material, where $H_{ext}$ represents an external magnetic field strength, and where $M_{eff}$ represents the effective PMA strength of the magnetic film. $M_{eff}$ indicates the amount of external energy that is required to the turn the magnetization direction of the magnetic film, from perpendicular to in-plane.

The spin diode device 100 may operate without the need for an external magnetic field, and hence, $H_{ext}=0$. As such, natural FMR frequencies of magnetic films may be expressed as:

$$f = 4\pi\gamma M_{eff}$$

In other words, the FMR frequency of the respective magnetic films may be directly proportional to $M_{eff}$ which depends primarily on the interface effect and the bulk effect. The interface effect may be caused by orbital deformation due to the breaking periodicity at an interface. The bulk effect may be caused by orbital deformation due to crystal spatial asymmetry. At an interface of a magnetic film, an electron may have an additional magnetic energy due to spin-orbit interaction. This additional energy may be substantial such that the direction of the equilibrium magnetization of the magnetic film becomes perpendicular to the plane, in other words, out-of-plane. The PMA strength of a magnetic film may depend on a thickness of the magnetic film, its composition, crystallinity structure and the layers that are adjacent to the magnetic film.

For example, the thicknesses of the lower magnetic films 312, 316 may be in a range of about 2 nm to about 10 nm in order to achieve PMA with natural FMR frequency, and thereby operating frequency, in the range of about 5 GHz to about 40 GHz. For example, the thicknesses of the upper magnetic films 322, 326 may be in a range of about 1.5 nm to about 3.0 nm in order to achieve PMA with natural FMR frequency, and thereby operating frequency, in the range of about 1.5 GHz to about 20 GHz. For example, the thicknesses of the upper magnetic films 322, 326 may be in a range of about 0.4 nm to about 2.0 nm in order to achieve PMA with natural FMR frequency, and thereby operating frequency, in the range of about 2 GHz to about 5 GHz.

The MTJ stack 150 may further include a seed layer 310. The seed layer 310 may overlie the lower electrode 130. The seed layer 310 may be disposed under the lower magnetic layer 102, and also under the lower magnetic film 312. The seed layer 310 may include platinum. The seed layer 310 may also include nickel, chromium, ruthenium, tungsten, magnesium, holmium, or terbium in various embodiments. The seed layer 310 may be about 5 nm in thickness. The thickness and the material of the seed layer 310 need not be limited to those stated above, as long as the seed layer 310 is able to achieve a crystallized template for the lower magnetic film 312.

The MTJ stack 150 may further include a transition layer 318. The transition layer 318 may be provided over the lower magnetic layer 102. The transition layer 318 may overlie the further lower magnetic film 316, if it is present in the lower magnetic layer 102. The transition layer 318 may be non-magnetic. The transition layer 318 may include tantalum, iron, tungsten, molybdenum, terbium, iron, cobalt, or other elements, either as alloys or as one or more pinned layers, in some embodiments. The transition layer 318 may serve to break the crystalline structure from the underlying further lower magnetic film 316 (or other pinned layer, where more than two pinned layers are utilized). The transition layer 318 may be amorphous in some embodiments. The transition layer 318 may be thin enough such that a crystalline structure is not formed, for example, the transition layer 318 may be about 0.2 nm to 0.5 nm in thickness. The transition layer 318 may be non-magnetic, and the amorphous nature of the transition layer 318 may allow for the non-magnetic characteristic even in embodiments that include iron, cobalt, or other materials that typically are magnetic.

The MTJ stack 150 may further include a polarizer layer 320. The polarizer layer 320 may overlie the transition layer 318. The polarizer layer 320 may be magnetic. The polarizer layer 320 may include cobalt, iron, boron, alloys thereof, or combinations thereof, which may be present as alloys or as individual components, and which may be present as a single layer or as multiple layers, in various embodiments. The polarizer layer 320 may have a crystalline structure that is imparted to overlying layers in some embodiments, and may improve spin polarization efficiency in the MTJ stack 150. The polarizer layer 320 may have a face centered cubic crystalline structure, but other types of crystalline structures may also be possible.

The MTJ stack 150 may further include a capping layer 330. The capping layer 330 may be arranged over the upper magnetic layer 106. The MTJ stack 150 may further include an optional top barrier layer 328 arranged over the upper magnetic layer 106. The capping layer 330 may overlie the optional top barrier layer 328 where the top barrier layer 328 is present. As such, the upper magnetic layer 106 may be sandwiched between the tunnel barrier layer 104 and the top barrier layer 328 in embodiments where the top barrier layer 328 is present. The upper electrode 140 may overlie the capping layer 330. The capping layer 330 may further promote the magnetic anisotropic effect of the MTJ stack 150. The capping layer 330 may include one or more of tungsten, magnesium oxide, ruthenium, platinum, hafnium, nickel chromium, or other materials, either as alloys or as elements. The capping layer 330 may be non-magnetic, and the composition of the capping layer 330 may depend on the material of the upper magnetic films 322, 326. The optional top barrier layer 328 may include magnesium oxide in some embodiments, and the top barrier layer 328 may be non-magnetic. The capping layer 330 may be about 0.2 nm to about 2.0 nm in thickness. The top barrier layer 328 may be about 1 nm in thickness.

According to various non-limiting embodiments, the spin diode device 300 may be fabricated using the same production line and processes as the production of MRAM devices. The lower magnetic layer 102 may include a synthetic antiferromagnet (SAF), such that it may be a fixed layer. The upper magnetic layer 106 may be a free layer.

According to a non-limiting exemplary embodiment, the composition and thicknesses of each layer of the spin diode device 300 are described in the following. Each of the lower and upper electrodes 130, 140 may be about 5 nm in thickness and may include tantalum. The seed layer 310 may be about 5 nm in thickness and may include platinum. The lower magnetic film 312 may include six repetitions of a bi-layer film including 0.4 nm of cobalt and 0.4 nm of platinum. The lower coupling layer 314 may be about 0.4 nm in thickness and may include ruthenium. The further lower magnetic film 316 may include four repetitions of the bi-layer film including 0.4 nm of cobalt and 0.4 nm of platinum. The transition layer 318 may be about 0.4 nm in thickness and may include tantalum. The polarizer layer 320 may be about 1.0 nm in thickness and may include $Co_{20}Fe_{60}B_{20}$. The tunnel barrier layer 104 may be about 1.0 nm in thickness and may include magnesium oxide. The upper magnetic film 322 may be about 1.2 nm in thickness and may include $Co_{20}Fe_{60}B_{20}$. The insertion layer 324 may be about 0.4 nm in thickness and may include tantalum. The further upper magnetic film 326 may be about 0.9 nm in thickness and may include $Co_{20}Fe_{60}B_{20}$. The top barrier layer 328 may be about 1.0 nm in thickness and may include magnesium oxide. The capping layer 330 may be about 1 nm in thickness and may include tungsten.

Figure 4:
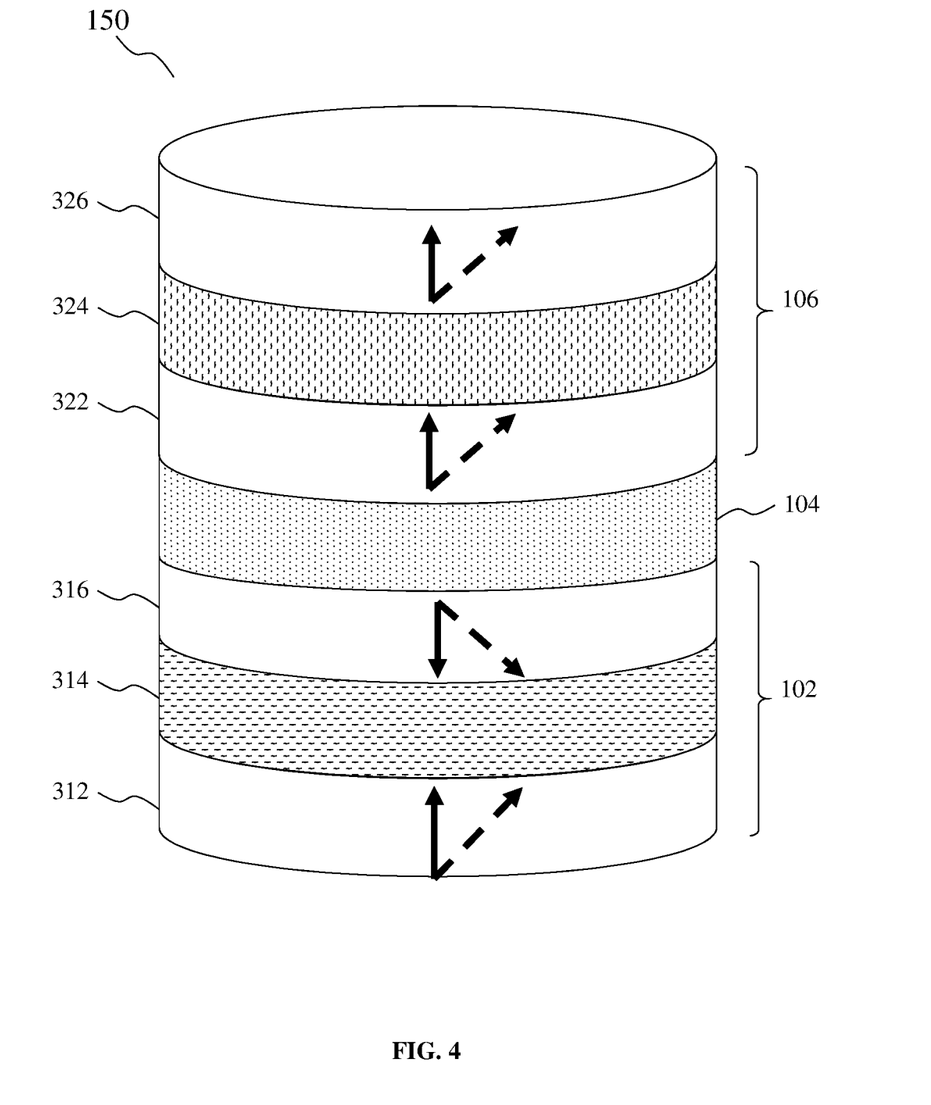
FIG. 4 shows a schematic diagram of a MTJ stack, and illustrates the operating principle of the spin diode device of FIG. 3.

FIG. 4 shows a schematic diagram of the MTJ stack 150, and illustrates the operating principle of the spin diode device 300 of FIG. 3. In the embodiment shown in FIG. 3, the lower magnetic layer 102 includes two lower magnetic films 312, 316 separated by a lower coupling layer 314. The magnetization directions of the lower magnetic film 312 and the further lower magnetic film 316 may be antiparallel, and these lower magnetic films 312, 316 may have different natural FMR frequencies. For example, the natural FMR frequency of the lower magnetic film 312 may be $f_{L1}$, while the natural FMR frequency of the further lower magnetic film 316 may be $f_{L2}$. The magnetization directions of the upper magnetic film 322 and the further upper magnetic film 326 may be the same, as a result of the interlayer exchange coupling effect mediated by the thickness and material choice of coupling layer 524. Therefore, the upper magnetic films 322 and 326 may act as a single entity with a resulting single natural FMR frequency $f_U$. The spin diode device 300 may be configured to detect microwave that oscillates according to any one of $f_{L1}$, $f_{L2}$, or $f_U$. In other words, the spin diode device 300 may be capable of detecting microwaves of three different frequencies. When the incident microwave has a frequency of $f_U$, both the upper magnetic film 322 and the further magnetic film 326 enter FMR and absorbs at least part of the microwave energy. When the incident microwave has a frequency of $f_{L1}$, only the lower magnetic film 312 enters FMR. When the incident microwave has a frequency of $f_{L2}$, only the further lower magnetic film 316 enters FMR. Like described with respect to FIG. 2, when any one of the magnetic films resonate, the effective resistance of the MTJ 150 changes, which produces a rectification effect in the spin diode device 300, that enables the spin diode device 300 to detect the microwave.

Figure 5:
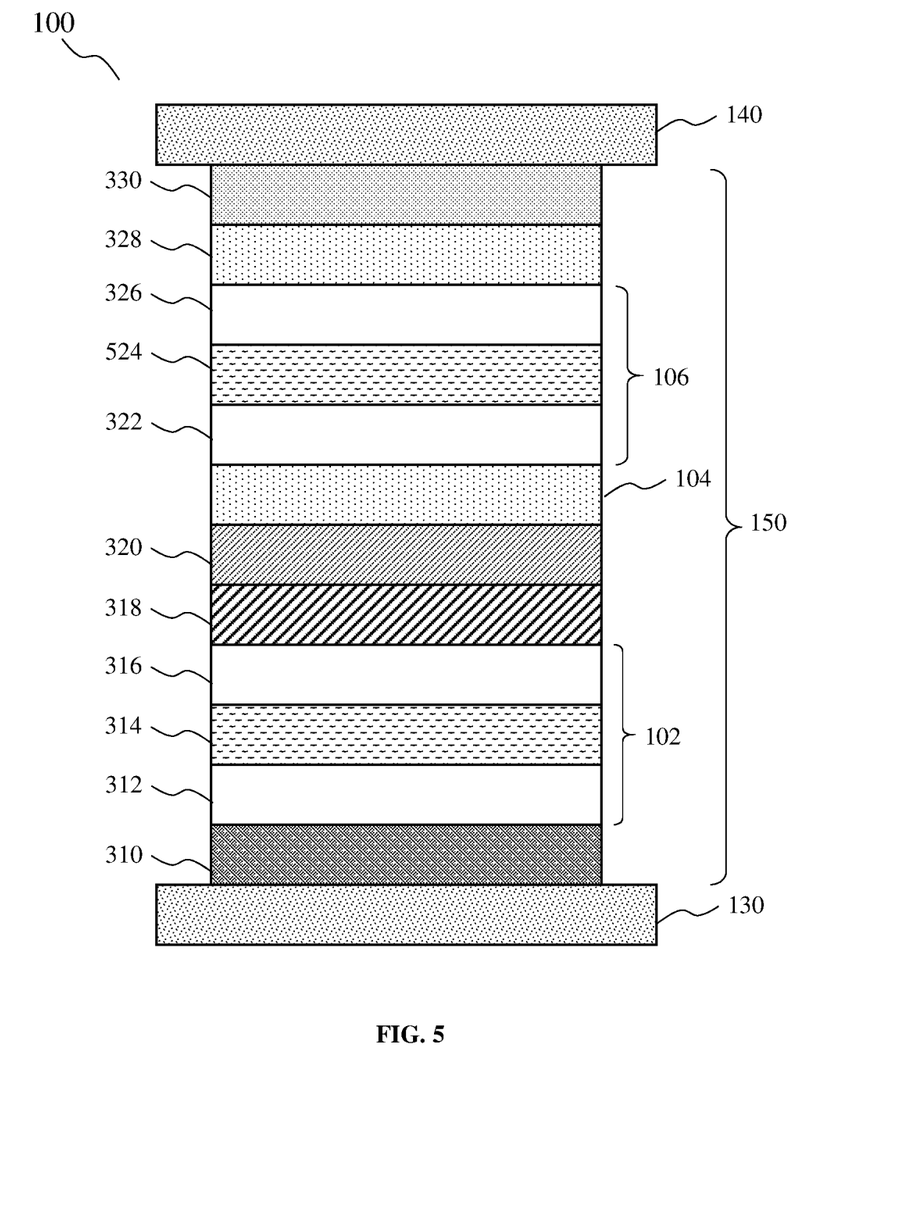
FIG. 5 shows a schematic diagram of the spin diode device according to various non-limiting embodiments.

FIG. 5 shows a schematic diagram of the spin diode device 500 according to various non-limiting embodiments. The spin diode device 500 shown in FIG. 5 may be similar to the spin diode device 300 shown in FIG. 3, with the exception that the insertion layer 324 is replaced by an upper coupling layer 524. The upper coupling layer 524 may be similar to the lower coupling layer 314, in its function. The upper coupling layer 524 may also be an inter-layer exchange coupling layer, and may serve to maintain anti-parallel magnetization directions for the upper magnetic film 322 and the further upper magnetic film 326. By having antiparallel magnetization direction for the upper magnetic film 322 and the further upper magnetic film 326, as well as for the lower magnetic film 312 and the further lower magnetic film 316, the spin diode device 100 may be configured to detect microwaves of four different frequencies. In the spin diode device 500, both the upper and lower magnetic layers 102, 106 may include SAF. Each of the upper coupling layer 524 and the lower coupling layer 314 may include ruthenium.

Figure 6:
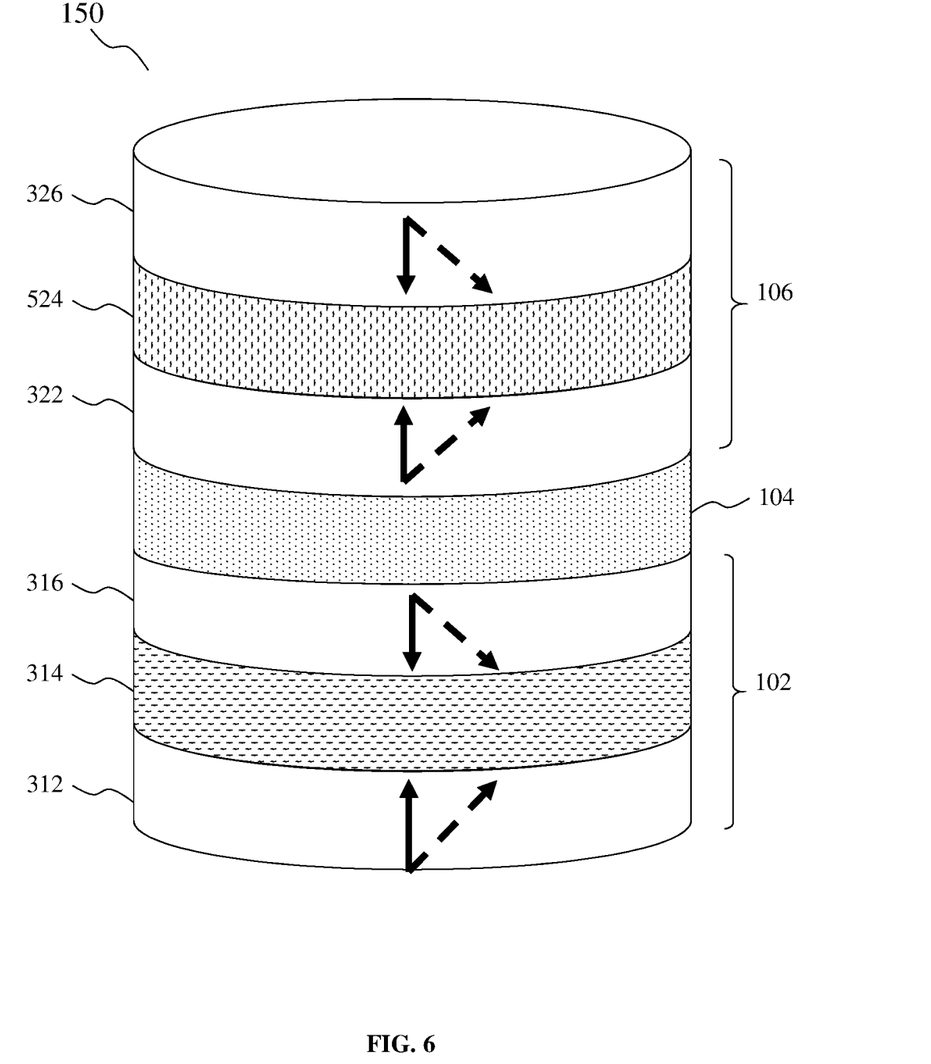
FIG. 6 shows a schematic diagram of a MTJ stack and illustrates the operating principle of the spin diode device of FIG. 5.

FIG. 6 shows a schematic diagram of the MTJ stack 150, and illustrates the operating principle of the spin diode device 500 of FIG. 5. The magnetization directions of the upper magnetic film 322 and the further upper magnetic film 326 may be antiparallel, and these upper magnetic films 322, 326 may have different natural FMR frequencies. For example, the natural FMR frequency of the upper magnetic film 322 may be $f_{U1}$, while the natural FMR frequency of the further upper magnetic film 326 may be $f_{U2}$. The spin diode device 100 may be configured to detect microwave that oscillates according to any one of $f_{L1}$, $f_{L2}$, $f_{U1}$ or $f_{U2}$. In other words, the spin diode device 500 may be capable of detecting microwaves of four different frequencies. When the incident microwave has a frequency of $f_{U1}$, only the upper magnetic film 322 enters FMR. When the incident microwave has a frequency of $f_{U2}$, only the further upper magnetic film 326 enters FMR. Like described with respect to FIG. 2, when any one of the magnetic films resonate, the effective resistance of the MTJ 150 changes, which produces a rectification effect in the spin diode device 500, that enables the spin diode device 500 to detect the microwave.

While the spin diode devices 300 and 500 include two magnetic films in each of the lower and upper magnetic layers 102, 106, it should be understood that the lower and upper magnetic layers 102, 106 may include more than two magnetic films. Each magnetic film may be separated from an underlying magnetic film by a coupling layer similar to the lower coupling layer 314 or the upper coupling layer 514, or an insertion layer similar to the insertion layer 324. For example, the lower magnetic layer 102 may include a further lower coupling layer over the further lower magnetic film 316, and a second further lower magnetic film arranged over the further lower coupling layer. Similarly, the upper magnetic layer 106 may include a further upper coupling or a further insertion layer over the further upper magnetic film 326, and a second further upper magnetic film arranged over the further upper coupling layer or further insertion layer.

The spin diode devices 100, 300 and 500 described above may achieve various advantages as compared to prior art devices. By having PMA in each of the lower and upper magnetic layers 102, 106, both magnetic layers may be capable of detecting microwaves with high sensitivity up to −50 dBm by operating in the FMR mode. These magnetic layers may be able to operate in the FMR mode without the need for any external biasing energy to turn the magnetization directions to the perpendicular directions. As such, the spin diode devices are always "ON", as there is no need to power up the devices with an external current or magnetic field. Further, each of the lower and upper magnetic layers 102, 106 may be able to harness microwave of at least one frequency. In embodiments where the lower magnetic layer 102 and/or the upper magnetic layer 106 includes more than one magnetic film separated by an inter-layer exchange coupling layer, the spin diode device may be capable of simultaneously detecting or harnessing microwaves of 3 or more different frequencies. Each magnetic film in the MTJ stack 150 may be structured to have a PMA strength that is specific to the desired application. For example, $M_{eff}$ equivalent to 800 Oe for harvesting 2.4 GHz microwave, and $M_{eff}$ equivalent to 1650 Oe for harvesting 5 GHz microwave. The spin diode device may be easy to calibrate for sensing applications, as the FMR frequency is linearly correlated to the $M_{eff}$, and thereby, the PMA strength of the magnetic films. The spin diode device may also be smaller in size as compared to conventional spin diode devices.

According to various non-limiting embodiments, the spin diode devices 100, 300, 500 may be capable of detecting microwaves with frequencies in the range of about 1 GHz to about 100 GHz.

Figure 7:
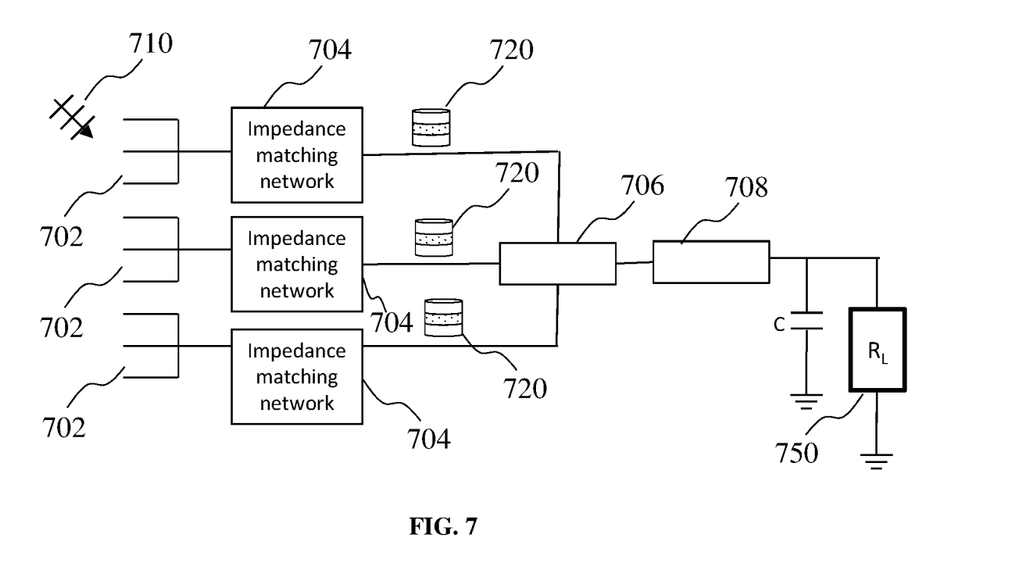
FIG. 7 shows an electrical circuit diagram of a microwave device according to various non-limiting embodiments.

FIG. 7 shows an electrical circuit diagram of a microwave device 700 according to various non-limiting embodiments. The microwave device 700 may include at least one spin diode 720. The spin diode 720 may include any one of the spin diode devices 100, 300 or 500. The microwave device 700 may further include at least one antenna 702, at least one impedance matching network 704, a direct current (DC) combiner 706, and a DC-DC convertor 708. The at least one antenna 702 may be configured to receive microwave 710. The received microwave may pass through the impedance matching network 704, to reach the spin diode 720. Each set of an antenna 702, an impedance matching network and a spin diode 720 may be connected in parallel to other similar sets. The DC combiner 706 may be configured to receive outputs of each spin diode 720 and may be further configured to combine their outputs for providing to the DC-DC convertor 708, which may be connected to a load 750.

Figure 8:
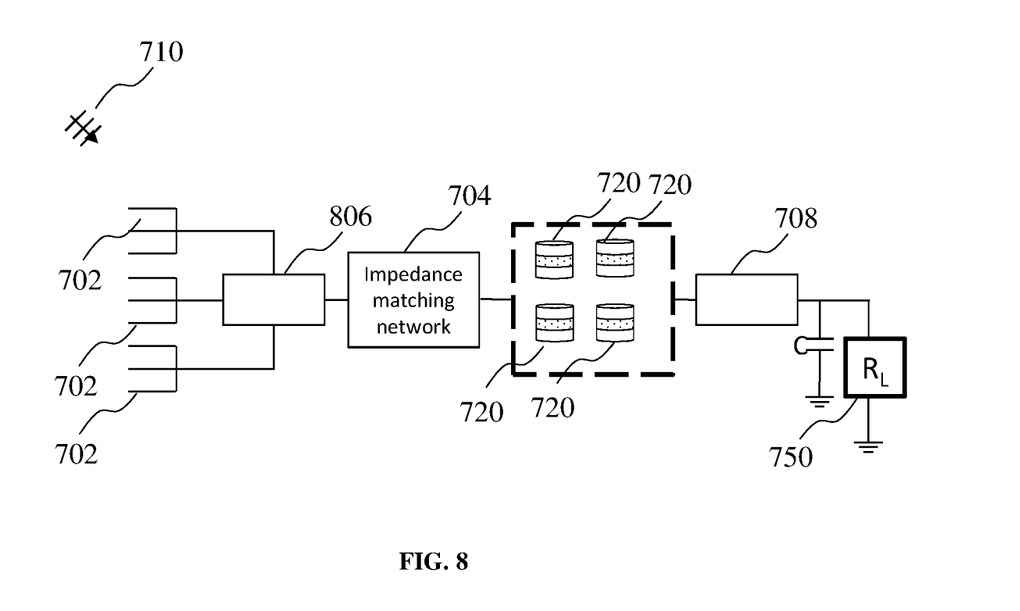
FIG. 8 shows an electrical circuit diagram of a microwave device according to various non-limiting embodiments.

FIG. 8 shows an electrical circuit diagram of a microwave device 800 according to various non-limiting embodiments. The microwave device 800 may be similar to the microwave device 700, but with a different connection of its components. In the microwave device 800, at least one antenna 702 may be connected to a radio frequency (RF) combiner 806. The RF combiner 806 may combine the microwave signals received in the at least one antenna 702 and provide a combined RF signal to an array of the spintronic devices 720 through the impedance matching network 704. The output from the array of the spintronic devices 720 may be provided to the DC-DC convertor 708.

According to various non-limiting embodiments, the microwave device 700 or 800 may be configured to harness input microwave wave of −10 dBm or smaller in power. The sensitivity of the microwave device 700 or 800 may further depend on other factors, such as increased microwave loss due to additional impedance from additional wiring/components.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A microwave detecting device comprising:
    a spin diode device configured to detect a microwave signal oscillating at one of a first target oscillating frequency and a second target oscillating frequency, the spin diode device comprising:
        a magnetic tunnel junction stack disposed between a lower electrode and an upper electrode of the spin diode device, the magnetic tunnel junction stack comprising:
            a lower magnetic layer comprising a lower magnetic film;
            a tunnel barrier layer over the lower magnetic layer, the tunnel barrier layer comprising an insulating material; and
            an upper magnetic layer over the tunnel barrier layer, the upper magnetic layer comprising an upper magnetic film;
        wherein each of the lower magnetic film and the upper magnetic film has perpendicular magnetic anisotropy,
        wherein the lower magnetic film comprises a first perpendicular magnetic anisotropy strength corresponding to a first natural ferromagnetic resonance frequency, the first natural ferromagnetic resonance frequency corresponds to the first target oscillating frequency,
        wherein the upper magnetic film comprises a second perpendicular magnetic anisotropy strength corresponding to a second natural ferromagnetic resonance frequency, the second natural ferromagnetic resonance frequency corresponds to the second target oscillating frequency,
        wherein the second perpendicular magnetic anisotropy strength is different from the first perpendicular magnetic anisotropy strength, wherein the second natural ferromagnetic resonance frequency is different from the first natural ferromagnetic resonance frequency.

2. The microwave detecting device of claim 1, wherein magnetization directions of the lower magnetic film and the upper magnetic film are antiparallel.

3. The microwave detecting device of claim 1, wherein a resistance across the magnetic tunnel junction stack changes to a first resistance when a frequency of the microwave signal matches the first natural ferromagnetic resonance frequency and the lower magnetic film absorbs energy of the microwave signal to enter ferromagnetic resonance mode, and
    the resistance across the magnetic tunnel junction stack changes to a second resistance when the frequency of the microwave signal matches the second natural ferromagnetic resonance frequency and the upper magnetic film absorbs energy of the microwave signal to enter ferromagnetic resonance mode, wherein the microwave detecting device is configured to detect the microwave signal based on the change in resistance across the magnetic tunnel junction stack.

4. The microwave detecting device of claim 1, further comprising:
    an electrical current measuring device configured to measure a magnitude and/or a direction of an electrical current travelling between the lower electrode and the upper electrode and determine the microwave signal oscillates at one of the first target oscillating frequency and the second target oscillating frequency based on the magnitude and/or direction of the electrical current.

5. The microwave detecting device of claim 1, wherein the lower magnetic layer comprises at least one pinned layer and the upper magnetic layer comprises at least one pinned layer.

6. The microwave detecting device of claim 1, further comprising:
    a second spin diode device;
    a plurality of antennas;
    at least one impedance matching network; and a DC-DC converter, wherein the plurality of antennas are coupled to the at least one impedance matching network, the at least one impedance matching network is coupled to the spin diode device and the second spin diode device, and the spin diode device and the second spin diode device are coupled to the DC-DC converter.

7. The microwave detecting device of claim 1, wherein the spin diode device is further configured to detect the microwave signal oscillating at a third target oscillating frequency, wherein the lower magnetic layer further comprises:

a lower coupling layer over the lower magnetic film, and a further lower magnetic film over the lower coupling layer, wherein the further lower magnetic film has a third perpendicular magnetic anisotropy strength corresponding to a third natural ferromagnetic resonance frequency, the third natural ferromagnetic resonance frequency corresponds to the third target oscillating frequency, wherein the third perpendicular magnetic anisotropy strength is different from the first and second perpendicular magnetic anisotropy strengths, wherein the third natural ferromagnetic resonance frequency is different from the first and second natural ferromagnetic resonance frequencies, wherein the third target oscillating frequency is different from the first and second target oscillating frequencies.

8. The microwave detecting device of claim 7, wherein magnetization directions of the lower magnetic film and the further lower magnetic film are antiparallel.

9. The microwave detecting device of claim 7, wherein the lower coupling layer is configured to provide an anti-ferromagnetic exchange between the lower magnetic film and the further lower magnetic film.

10. The microwave detecting device of claim 7, wherein each of the lower magnetic film and the further lower magnetic film comprises at least one bi-layer film, each bi-layer film comprising a cobalt-comprising layer and a platinum-comprising layer.

11. The microwave detecting device of claim 10, wherein the at least one bi-layer film of the lower magnetic film comprises six bi-layer films, and wherein the at least one bi-layer film of the further lower magnetic film comprises four bi-layer films.

12. The microwave detecting device of claim 10, wherein the cobalt-comprising layer ranges from about 0.2 to about 0.5 nm in thickness, and wherein the platinum-comprising layer ranges from about 0.2 to about 0.5 nm in thickness.

13. The microwave detecting device of claim 7, wherein the upper magnetic layer further comprises:

an upper coupling layer over the upper magnetic film, and a further upper magnetic film over the upper coupling layer, wherein the further upper magnetic film has perpendicular magnetic anisotropy, wherein the magnetization directions of the upper magnetic film and the further upper magnetic film are parallel so that the upper magnetic film and the further upper magnetic film act as a single entity comprising the second natural ferromagnetic resonance frequency.

14. The microwave detecting device of claim 13, wherein magnetization directions of the upper magnetic film and the further upper magnetic film are antiparallel.

15. The microwave detecting device of claim 13, wherein each of the upper magnetic film and the further upper magnetic film comprises cobalt, iron, boron, or alloys thereof.

16. The microwave detecting device of claim 13, wherein a thickness of each of the upper magnetic film and the further upper magnetic film ranges from about 0.4 nm to about 2.0 nm.

17. The microwave detecting device of claim 13, wherein the upper coupling layer is configured to provide an anti-ferromagnetic exchange between the upper magnetic film and the further upper magnetic film.

18. The microwave detecting device of claim 13, wherein the upper coupling layer comprises ruthenium.

19. The microwave detecting device of claim 7, wherein the spin diode device is further configured to detect the microwave signal oscillating at a fourth target oscillating frequency, wherein the upper magnetic layer further comprises:

an upper coupling layer over the upper magnetic film, and a further upper magnetic film over the upper coupling layer, wherein the further upper magnetic film has a fourth perpendicular magnetic anisotropy strength corresponding to a fourth natural ferromagnetic resonance frequency, the fourth natural ferromagnetic resonance frequency corresponds to the fourth target oscillating frequency, wherein the fourth perpendicular magnetic anisotropy strength is different from the first, second, and third perpendicular magnetic anisotropy strengths, wherein the fourth natural ferromagnetic resonance frequency is different from the first, second and third natural ferromagnetic resonance frequencies, wherein the fourth target oscillating frequency is different from the first, second and third target oscillating frequencies.

20. The microwave detecting device of claim 7, further comprising:

a non-magnetic transition layer over the lower magnetic layer; and a magnetic polarizer layer over the lower magnetic layer.

* * * * *